United States Patent
Diener

(10) Patent No.: US 9,741,547 B2
(45) Date of Patent: Aug. 22, 2017

(54) LOW-PRESSURE PLASMA SYSTEM WITH SEQUENTIAL CONTROL PROCESS

(71) Applicant: Christof-Herbert Diener, Nagold (DE)

(72) Inventor: Christof-Herbert Diener, Nagold (DE)

( * ) Notice: Subject to any disclaimer, the term of this patent is extended or adjusted under 35 U.S.C. 154(b) by 0 days.

(21) Appl. No.: 15/271,137

(22) Filed: Sep. 20, 2016

(65) Prior Publication Data

US 2017/0011888 A1   Jan. 12, 2017

Related U.S. Application Data

(63) Continuation of application No. PCT/EP2015/056636, filed on Mar. 26, 2015.

(30) Foreign Application Priority Data

Mar. 27, 2014   (DE) .................. 10 2014 205 695

(51) Int. Cl.
  *H01J 37/32*  (2006.01)
  *H01J 37/18*  (2006.01)
  *H01J 37/244*  (2006.01)

(52) U.S. Cl.
  CPC ........ *H01J 37/32449* (2013.01); *H01J 37/18* (2013.01); *H01J 37/244* (2013.01); *H01J 37/32009* (2013.01); *H01J 37/32825* (2013.01); *H01J 37/32926* (2013.01); *H01J 2237/186* (2013.01)

(58) Field of Classification Search
  CPC ........ H01J 37/186; H01J 37/18; H01J 37/244; H01J 37/32009; H01J 37/32449; H01J 37/32825; H01J 37/32926

USPC ................ 315/111.21, 111.91, 111.1, 111.71
  See application file for complete search history.

(56) References Cited

U.S. PATENT DOCUMENTS

| | | | |
|---|---|---|---|
| 4,219,705 A | * | 8/1980 | Hill .......................... G10K 7/00 381/111 |
| 4,313,783 A | | 2/1982 | Davies et al. |
| 4,657,620 A | | 4/1987 | Davis et al. |
| 4,700,315 A | | 10/1987 | Blackburn et al. |

(Continued)

FOREIGN PATENT DOCUMENTS

| | | |
|---|---|---|
| DE | 28 27 794 A1 | 1/1979 |
| DE | 698 15 951 T2 | 12/2003 |

(Continued)

*Primary Examiner* — Douglas W Owens
*Assistant Examiner* — Syed M Kaiser
(74) *Attorney, Agent, or Firm* — Hackler Daghighian Martino & Novak

(57) ABSTRACT

The low pressure plasma system includes a treatment chamber which is pumped out in a first process step by means of a pump. In a second process step a gas supply valve is opened in order to achieve a defined gas composition in the treatment chamber at low pressure. In a third process step a plasma generator is switched on in order to ignite a plasma in the treatment chamber. In a fourth process step a flushing valve can be opened in order to flush the treatment chamber. In a fifth process step the treatment chamber can be ventilated by way of a ventilation valve. The sequential switching element can be a rotary switch and include a zero switching position where the low pressure plasma system is off. The sequential switching element renders possible a simple embodiment of the low pressure plasma system and its intuitive operation.

15 Claims, 6 Drawing Sheets

(56) References Cited

U.S. PATENT DOCUMENTS

| | | | | |
|---|---|---|---|---|
| 4,985,657 A * | 1/1991 | Campbell | ............... | H01J 27/08 250/424 |
| 5,487,875 A * | 1/1996 | Suzuki | .............. | H01J 37/32229 219/691 |
| 8,525,419 B2 * | 9/2013 | Smith | .................... | H01J 27/16 315/111.21 |
| 8,530,854 B1 * | 9/2013 | Derzon | ................... | G21B 3/00 250/423 F |
| 8,648,604 B2 * | 2/2014 | Brucker | ................. | G01L 21/32 250/389 |
| 9,018,829 B2 * | 4/2015 | Koo | ........................ | H01J 37/08 313/359.1 |
| 2002/0125223 A1 * | 9/2002 | Johnson | ................ | H01J 37/321 219/121.43 |
| 2005/0039680 A1 | 2/2005 | Beaman et al. | | |
| 2005/0069011 A1 * | 3/2005 | Hill | ........................ | H01S 3/036 372/76 |
| 2013/0240144 A1 | 9/2013 | Buchberger | | |

FOREIGN PATENT DOCUMENTS

| | | |
|---|---|---|
| DE | 698 28 104 T2 | 12/2005 |
| DE | 20 2010 001 497 U1 | 4/2010 |
| EP | 0 180 373 A2 | 5/1986 |
| JP | S60 64770 A | 4/1985 |

* cited by examiner

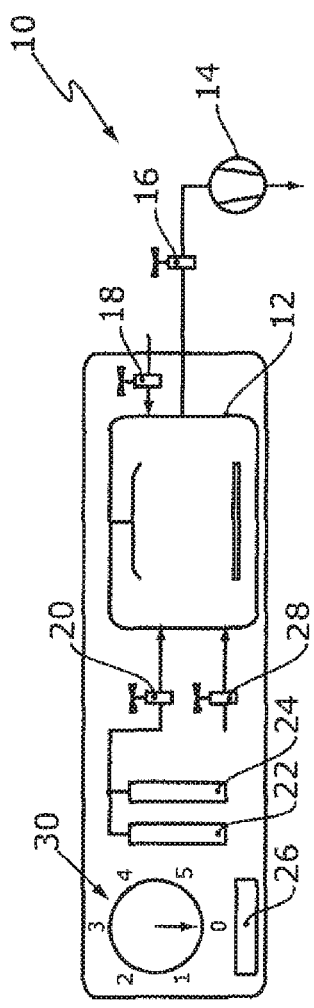
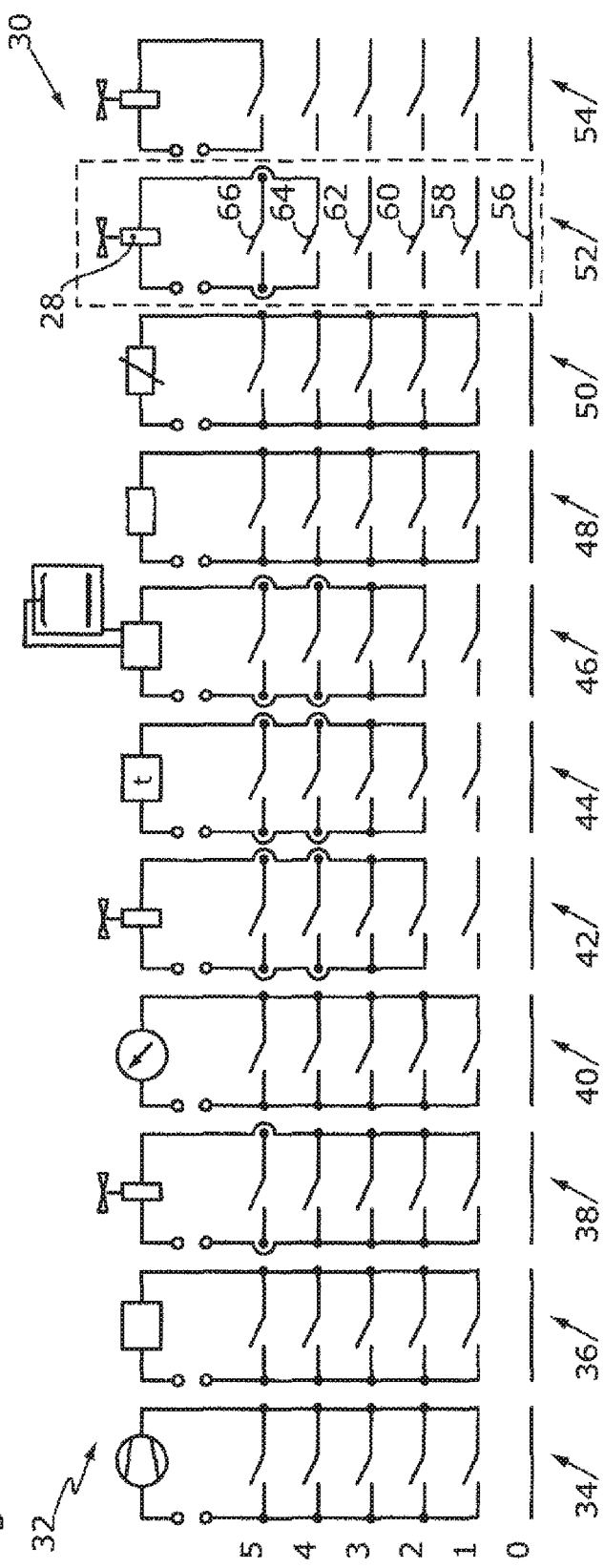
Fig. 1a
Fig. 1b

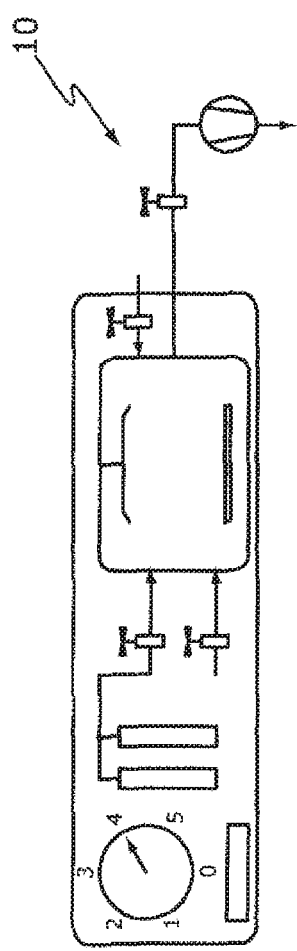
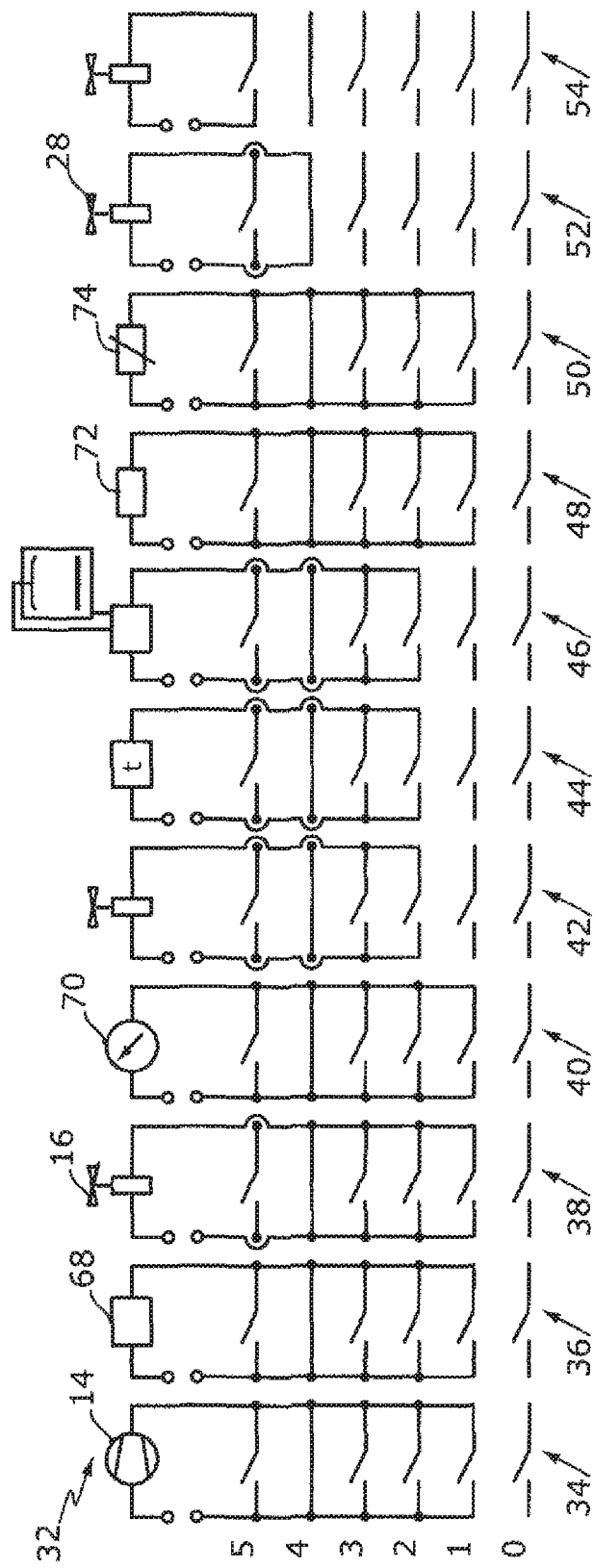
Fig. 5a
Fig. 5b

LOW-PRESSURE PLASMA SYSTEM WITH SEQUENTIAL CONTROL PROCESS

CROSS-REFERENCE TO RELATED APPLICATIONS

This continuation application claims priority to PCT/EP2015/056636 filed on Mar. 26, 2015, which has published as WO 2015/144848 A1, and also to German application number 10 2014 205 695.0 filed on Mar. 27, 2014, the entire contents of which are fully incorporated herein with these references.

DESCRIPTION

Field of the Invention

The invention relates to a low pressure plasma system having a treatment chamber that can be at least in part evacuated, a gas supply valve, a plasma generator and a controller, wherein the controller comprises a vacuum electric circuit, a gas supply electric circuit and a plasma electric circuit, wherein the vacuum electric circuit controls a pump, which can be connected to the low pressure plasma system, and/or a pump valve of the low pressure plasma system, the gas supply electric circuit controls the gas supply valve and the plasma electric circuit controls the plasma generator.

Background of the Invention

Low pressure plasma systems for treating a component in a treatment chamber that can be in part evacuated have been known for a long time. The component is placed into the treatment chamber so as to treat the component. The treatment chamber is subsequently at least in part evacuated. For this purpose, a pump is provided that can be a part of the low pressure plasma system or an external unit. The at least in part evacuation of the treatment chamber can be performed by means of controlling the pump. As an alternative or in addition thereto, a pump valve can be opened between the treatment chamber and pump in order to lower the pressure in the treatment chamber.

The treatment chamber is pumped out for as long as it takes to achieve the desired pressure. The desired process gas is subsequently introduced into the treatment chamber by way of the gas supply valve. The treatment chamber is also further pumped out while introducing the gas so that in the case of a gas supply that remains constant an equilibrium is set between the gas that is pumped out and the gas that is supplied. After stabilizing the gas pressure ratios in the treatment chamber, the plasma generator is switched on in order to ignite a plasma in the treatment chamber. The component is treated by means of the ignited plasma. The plasma can be a direct current voltage plasma or an alternating current voltage plasma.

Plasma systems are known in which these process steps are controlled fully automatically. The fully automatic controllers generally comprise microcontrollers, microprocessors, FPGA's (field programmable gate arrays) and/or programmable logic controllers. However, it is disadvantageous that generally contactors have to be used on the fully automatic controllers in order to connect the high supply voltages for the low pressure plasma system, in particular the plasma generator, to the controller. Furthermore, it is necessary to connect different operating voltages by means of the fully automatic controller. Generally, it is necessary to provide single-phase alternating current voltages (for example 110 Volt and/or 230 Volt) for the pump, three-phase alternating current voltages (for example 208 Volt and/or 400 Volt) for the plasma generator and direct current voltage at 24 Volt for valves and other low voltage consumers of the low pressure plasma system and to connect said voltages by means of the controller. A fully automatic controller is therefore accordingly complex and cost-intensive.

In an alternative to a fully automatic controller, it is known to control various components of the low pressure plasma system individually by means of mechanical switches that are actuated by a user. In this case, a switch is provided for the pump, a switch is provided for the gas supply and a switch is provided for the plasma generator. Generally, the low pressure plasma system comprises further switches for controlling further components. Although a low pressure plasma system having a controller of this type can be embodied in a simple and cost-effective manner, there is however the increased risk that a user of the low pressure plasma system actuates the mechanical switches in the incorrect sequence. This risk is present in particular in the case of untrained users of the low pressure plasma system. If by way of example the treatment chamber is ventilated, as long as the pump is still running, the oil consumption of the pump increases considerably. Furthermore, the process of controlling the low pressure plasma system by means of actuating individual mechanical switches is uncomfortable for the user.

The object of the present invention is therefore to provide a low pressure plasma system that is embodied in both a constructively simple and consequently cost-effective manner as well as rendering possible an intuitive and reliable operation.

This object is achieved by means of a low pressure plasma system having the features of the independent claims. The dependent claims disclose expedient further developments.

SUMMARY OF THE INVENTION

The low pressure plasma system in accordance with the invention that is described in the introduction consequently comprises a controller having a sequential switching element having switching positions that follow one another for controlling the process steps that follow one another, wherein the sequential switching element is embodied so as in each switching position to interrupt and to close respectively the vacuum electric circuit, the gas supply electric circuit and the plasma electric circuit by means of multiple switches (plurality of switches) that are electrically isolated from one another, wherein the sequential switching element comprises a first switching position in which the vacuum electric circuit is closed but the gas supply electric circuit and the plasma electric circuit are interrupted, wherein the sequential switching element comprises a second switching position, in which the vacuum electric circuit and the gas supply electric circuit are closed but the plasma electric circuit is interrupted and wherein the switching element comprises a third switching position in which the vacuum electric circuit, the gas supply electric circuit and the plasma electric circuit are closed.

The controller of the low pressure plasma system consequently comprises at least three circuits: a vacuum electric circuit for controlling the pump and/or the pump valve for at least in part evacuating the treatment chamber, a gas supply electric circuit for controlling the gas supply valve for admitting a process gas into the treatment chamber, and a plasma electric circuit for controlling a plasma generator by means of which it is possible to ignite a plasma in the treatment chamber. The vacuum electric circuit, the gas supply electric circuit and the plasma electric circuit can be controlled by means of the sequential switching element.

The sequential switching element comprises in each case multiple switches for controlling the vacuum electric circuit, the gas supply electric circuit and the plasma electric circuit and it is possible to open and close said switches successively.

By virtue of the sequential embodiment of the switching element, a user of the low pressure plasma system is forced to perform the process steps in the sequence that is predetermined by means of the sequential switching element. The operation of the low pressure plasma system is consequently particularly simple. It is merely necessary for the user to adjust the sequential switching element step-by-step in order to be able to perform the process steps. It is possible by means of the switches that are electrically isolated from one another for the different electric circuits to be connected without using relays, contactors or the like. Furthermore, the controllers do not require any software.

In other words, different consumer voltages (by way of example 24 Volt, 230 Volt and 400 Volt) can be controlled by way of their dedicated switch of the sequential switching element in a constructively simple and cost-effective manner. The switches that are electrically isolated from one another can be embodied as closers or openers. Furthermore, one part of the switches can be embodied as openers and one part of the switches can be embodied as closers. In order to embody the controller in a particularly simple manner, it is preferred that only closers are used in the sequential switching element so as to control the vacuum electric circuit, the gas flow circuit and the plasma electric circuit.

The controller of the low pressure plasma system can comprise a flushing process electric circuit having a flushing valve in order to flush poisonous gases out of the treatment chamber after the plasma treatment. In this case, the sequential switching element is embodied so as to interrupt and to close its flushing process electric circuit, wherein the switching element comprises a fourth switching position in which the vacuum electric circuit and the flushing process electric circuit are closed but the gas supply electric circuit and the plasma electric circuit are interrupted, wherein the flushing process electric circuit is interrupted in the switching positions 1 to 3. The process steps that can be controlled by means of the sequential switching element are then:

1. Pumping out the treatment chamber by means of closing the vacuum electric circuit in the switching position 1;
2. Controlling the process gas by means of additionally closing the gas supply electric circuit in the switching position 2;
3. Performing the plasma treatment by means of additionally closing the plasma electric circuit in the switching position 3; and
4. Flushing by means of closing the flushing process electric circuit and opening the gas supply electric circuit and also the plasma electric circuit in the switching position 4.

In a preferred embodiment of the invention, the controller of the low pressure plasma system comprises a ventilation process electric circuit having a ventilation valve, wherein the sequential switching element is embodied so as to interrupt and to close the ventilation process electric circuit, wherein the switching element comprises a fifth switching position in which the ventilation process electric circuit is closed but the vacuum electric circuit, the gas supply electric circuit, the plasma electric circuit and in particular the flushing process electric circuit are interrupted, wherein the ventilation process electric circuit is interrupted in the switching positions 1 to 3 and in particular in the switching position 4. The sequential switching element is consequently embodied so as to switch a further process step in which the treatment chamber can be ventilated by means of a ventilation valve. If merely non-poisonous gases are used for the plasma treatment, the ventilation process can thus directly follow process step 3 (plasma treatment). As an alternative thereto, the process step, ventilation, can follow the process step 4 (flushing).

The pressure ratios in the treatment chamber of the low pressure plasma system can be controlled by means of a time measurement. By way of example, the process step 1 (pumping out the treatment chamber) can be performed for a specific time period in order to ensure that a desired base pressure is achieved. It is therefore not mandatory to provide a pressure measuring device in the low pressure plasma system. However, the low pressure plasma system can be controlled in a precise manner by means of a pressure measuring electric circuit having a pressure measuring device, wherein the sequential switching element is embodied so as to interrupt and to close the pressure measuring electric circuit, wherein the pressure measuring electric circuit is closed in the switching positions 1 to 3, and also in particular in the switching positions 4 and/or 5. By means of the pressure measuring device, the user can precisely monitor the pressure prevailing in the treatment chamber.

The user can make the "further switching" of the sequential switching element dependent upon the pressure display of the pressure measuring device. In a preferred embodiment of the invention, the pressure measuring device is in contrast embodied for the purpose of transmitting a first enable signal to the gas supply valve to enable same and/or to the plasma generator in order to enable same. In this case, the subsequent process step can be prevented from being performed if the user further switches the sequential switching element "too early", in other words if a "further switching" occurs without the necessary gas pressure ratios in the treatment chamber being present. As a consequence, the safety and the procedural stability of the low pressure plasma system is significantly increased.

The controller of the low pressure plasma system preferably comprises a timer electric circuit having a timer, wherein the sequential switching element is embodied so as to interrupt and to close the timer electric circuit, wherein the timer electric circuit is closed in the switching position 3. In addition thereto, the timer can be closed in the switching position 2 (introducing the process gas). The duration of the process, in other words the duration of the plasma treatment of the component, can be controlled in the treatment chamber.

The controller can furthermore comprise a heater electric circuit having a heating system, wherein the sequential switching element is embodied so as to interrupt and to close the heater electric circuit, wherein the heater electric circuit is closed in the switching position 3 (plasma treatment process). It is possible by means of the heating system to bring the component to an increased temperature during the plasma treatment process. The heater electric circuit can be closed in a further switching position or in multiple further switching positions in order to render it possible to preheat or reheat the component.

The controller preferably comprises a temperature measuring electric circuit having a temperature measuring element, wherein the sequential switching element is embodied so as to interrupt and to close the temperature measuring electric circuit, wherein the temperature measuring electric circuit is closed in the switching position 3.

The temperature measuring electric circuit can be closed in one or multiple further switching positions in order to monitor the temperature in the treatment chamber.

The operation of the low pressure plasma system can be further simplified if the controller comprises a power supply unit electric circuit having a power supply unit of the low pressure plasma system, wherein the sequential switching element is embodied so as to interrupt and to close the power supply unit electric circuit, wherein the power supply unit electric circuit is closed in the switching positions 1 to 3, and also in particular in the switching positions 4 and/or 5. The power supply unit of the low pressure plasma system uses the total current supply of the low pressure plasma system. In other words, switching off the power supply unit corresponds to switching off the low pressure plasma system by means of a "main switch". Consequently, the operation of the low pressure plasma system is simplified in that the sequential switch additionally assumes the function of the main switch, wherein the low pressure plasma system is completely switched off in a switching position of the sequential switching element.

A comprehensive control of the low pressure plasma system is rendered possible by means of the sequential switching element if the controller comprises a pump circuit having a pump power supply unit, wherein the sequential switching element is embodied so as to interrupt and to close the pump electric circuit, wherein the pump electric circuit is closed in the switching positions 1 to 3, and also in particular in the switching positions 4 and/or 5. The electric pump is supplied with voltage by way of the pump electric circuit. If the pump electric circuit is interrupted, the pump is thereby switched off. In other words, the pump is switched on and switched off by means of the sequential switching element.

The controller of the low pressure plasma system can furthermore comprise a safety electric circuit having a safety switch, in particular a door switch of the treatment chamber, wherein the sequential switching element is embodied so as to interrupt and to close the safety electric circuit, wherein the safety electric circuit is closed in the switching positions 1 to 3 and also in particular in the switching positions 4 and/or 5. The safety electric circuit can be embodied so as to interrupt the processes that are performed in the low pressure plasma system. In particular, it is possible to disconnect the gas supply and the plasma generator by means of the safety electric circuit if the door of the treatment chamber is open. The safety electric circuit is used in particular to switch off the plasma generator in order to avoid a user receiving an electric shock. The safety electric circuit is in particular advantageous if the treatment chamber is not a glass chamber.

The vacuum electric circuit, the gas supply electric circuit, the plasma electric circuit, the flushing process electric circuit and/or the ventilation process electric circuit can comprise a lamp, in particular a light emitting diode so as to intuitively illustrate the respective process step. The lamp is preferably arranged in the region of the respective switching position of the sequential switching element on the side of the low pressure plasma system that is facing the user. The user immediately sees by means of the lamp or lamps which electric circuit or electric circuits of the low pressure plasma system is/are closed, in other words which process step or process steps is/are being performed.

In a particularly preferred embodiment of the invention, the sequential switching element of the low pressure plasma system can comprise a zero switching position in which all electric circuits of the controller are interrupted. As a consequence, it is not necessary to provide separate "on and off switches" on the low pressure plasma system. On the contrary, the low pressure plasma system in this case can switch itself on and off by means of the sequential switching element.

In general, it should be noted that the sequential switching element is preferably embodied for the purpose of closing in each switching position a plurality of switches of the sequential switching element, said switches being electrically isolated from one another. An arbitrary electric circuit of the controller is then closed in an individual switching position of the sequential switching element if said electric circuit makes contact with one of the switches of this switching position. On the other hand, an electric circuit in this switching position is interrupted or opened if said electric circuit does not make electrical contact with a switch of this switching position.

The sequential switching element can be embodied by way of example in the form of a sliding switch. However, in a particularly preferred embodiment of the sequential switching element, said switching element is in the form of a rotary switch. By virtue of embodying the sequential switching element in the form of a rotary switch, the sequential switching element is located automatically back in the starting position after performing a complete process. The rotary switch is preferably embodied as a 6-position rotary switch.

The rotary switch can merely be embodied as rotatable in one direction in order to entirely rule out an error in operating the low pressure plasma system. As an alternative thereto, it is possible that the rotary switch can be rotated in both directions. This is particularly advantageous if the controller comprises a ventilation process electric circuit having a ventilation valve. In this case, the rotary switch can be brought into the ventilating position by means of rotating in the "opposite direction" in order to ventilate the treatment chamber without having to perform a complete plasma treatment process.

Further features and advantages of the invention are evident in the detailed description hereinunder of an exemplary embodiment of the invention with reference to the figures of the drawing that illustrates the details essential for the invention and also the claims.

The features that are illustrated in the drawing are illustrated in such a manner that the characteristics in accordance with the invention can be made clearly visible. The various features can be realized individually or in multiple arbitrary combinations in the case of variants of the invention.

BRIEF DESCRIPTION OF THE DRAWINGS

The accompanying drawings illustrate the invention. In such drawings:

FIG. 1a illustrates a plan view of a low pressure plasma system in accordance with the invention in the switching position 0;

FIG. 1b illustrates schematically the controller of the plasma system in accordance with the FIG. 1a in the switching position 0;

FIG. 5a illustrates a plan view of a low pressure plasma system in accordance with the invention in the switching position 4;

FIG. 5b illustrates schematically the controller of the plasma system in accordance with the FIG. 5a in the switching position 4;

DETAILED DESCRIPTION OF THE PREFERRED EMBODIMENTS

Figure 2A:
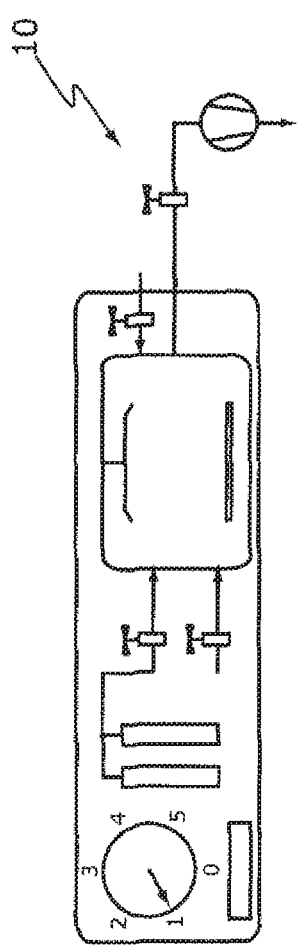
FIG. 2a illustrates a plan view of a low pressure plasma system in accordance with the invention in the switching position 1.

FIG. 1a illustrates a low pressure plasma system 10 in accordance with the invention. The low pressure plasma system 10 is illustrated in a heavily schematic manner. The low pressure plasma system comprises a treatment chamber 12 that can be at least in part evacuated by means of a pump 14. The pump 14 is connected in a fluid manner by way of a pump valve 16 to the treatment chamber 12. Consequently, in the case of a switched-on pump 14 and an opened pump valve 16 the treatment chamber 12 can be at least in part evacuated. The pump valve 16 is preferably embodied in the form of an angle valve.

A ventilation valve 18 is provided in order to ventilate the treatment chamber 12. A process gas can be admitted into the treatment chamber 12 by way of a gas supply valve 20. The process gas can be ambient air. As an alternative or in addition thereto, one or multiple gases can be admitted into the treatment chamber 12 as the process gas. In order to admit different gases into the treatment chamber 12, multiple gas supply valves 20 can be provided. In the present case, merely one gas supply valve 20 is provided, wherein a gas mixture prevails at the gas supply valve 20. The gas mixture is controlled by way of gas flow meters 22, 24 (float-type flow meters having a needle valve or mass flow controller). The pressure in the treatment chamber 12 can be displayed on a pressure display 26. A flushing valve 28 is provided for flushing poisonous gases out of the treatment chamber 12. It is possible using the low pressure plasma system 10 to perform the following process steps:
1. Pumping out the treatment chamber;
2. Controlling the process gas;
3. Plasma treatment;
4. Flushing; and
5. Ventilation.

The low pressure plasma system 10 comprises a sequential switching element 30 for controlling these process steps by means of corresponding switching positions. The switching position zero is set on the sequential switching element 30 in FIG. 1a. In this switching position, the low pressure plasma system 10 is switched off.

FIG. 1b illustrates in a schematic view a controller 32 of the low pressure plasma system 10 in accordance with FIG. 1a in the switching position zero. The controller 32 comprises essentially the sequential switching element 30 whose switching positions (from 0 to 5) are illustrated on the left side of FIG. 1b. The sequential switching element 30 comprises a pump electric circuit 34, a power supply unit electric circuit 36, a vacuum electric circuit 38, a pressure measuring electric circuit 40, a gas supply electric circuit 42, a timer electric circuit 44, a plasma electric circuit 46, a heater electric circuit 48, a temperature measuring electric circuit 50, a flushing process electric circuit 52 and a ventilation process electric circuit 54. The electric circuits 34, 36, 38, 40, 42, 44, 46, 48, 50, 52, 54 are electrical circuits. The sequential switching element 30 can furthermore comprise a safety electric circuit (not illustrated), in particular in order to render it possible to monitor a door of the treatment chamber 12 (see FIG. 1a).

As is evident in FIG. 1b, the sequential switching element 30 comprises for each switching position (0 to 5) in each case one switch for controlling the electric circuits 34, 36, 38, 40, 42, 44, 46, 48, 50, 52, 54. If an electric circuit 34, 36, 38, 40, 42, 44, 46, 48, 50, 52, 54 is to be closed in the respective switching position (0-5), the respective switch of the sequential switching element 30 is to be contacted in this switching position (0-5). This is further explained in an exemplary manner for the flushing process electric circuit 52 that is illustrated in FIG. 1b as framed with a dashed line.

The flushing process electric circuit 52 comprises a voltage source that is illustrated by means of two unfilled circles. The current flows from a first connector of the voltage source across the consumer (in this case the flushing valve 28) across one or multiple closed switches back to the second connector of the voltage source. The flushing process electric circuit 52 comprises for the switching positions 0 to 5 of the sequential switching element 30 in each case a switch 56, 58, 60, 62, 64, 66. The opened switches are illustrated with a line angled in the center (see switches 58, 60, 62, 64, 66) and the closed switches are illustrated with the continuous line (see switch 56).

The flushing valve 28 is only to be closed in the switching position 4 and is to be opened in all other switching positions (0-3 and 5). Therefore, in the flushing process electric circuit 52 only the switch 64 that is actuated in the switching position 4 is contacted. All the other switches 56, 58, 60, 62, 66 are not contacted in the flushing process electric circuit 52. The "non-contacting arrangement" of the switch 66 is illustrated by means of "bulge-shaped semicircles" of the electric circuit lines around the switch 66.

The above-mentioned explanations apply accordingly for the other electric circuits 34, 36, 38, 40, 42, 44, 46, 48, 50 and 54.

The switches of the sequential switching element 30, said switches being electrically isolated from one another, for forming the controller 32 are contacted as follows:

The vacuum electric circuit 38 contacts the first switch of the switching positions 1, 2 and 3 that correspond to the process steps of pumping out the treatment chamber, introducing process gas and plasma treatment.

It is preferred that the vacuum electric circuit 38 furthermore contacts the first switch of the switching positions 4 and/or 5 that correspond to the process steps of flushing and ventilation.

The gas supply electric circuit 42 contacts the second switch of the switching positions 2 and 3 that correspond to the process steps of introducing the process gas and plasma treatment.

The plasma electric circuit 46 contacts a third switch of the switching position 3 that corresponds to the process step, plasma treatment.

The preferably provided flushing process electric circuit 52 contacts a fourth switch of the switching position 4 that corresponds to the process step, flushing.

The ventilation process electric circuit 54 that is preferably provided contacts a fifth switch of the switching position 5 that corresponds to the process step, ventilation.

The pressure measuring electric circuit 40 that is preferably provided contacts the sixth switch of the switching positions 1, 2 and 3 that correspond to the process steps of pumping out the treatment chamber, controlling the process gas and plasma treatment.

It is preferred that the pressure measuring electric circuit 40 furthermore contacts the sixth switch of the switching positions 4 and/or 5 that correspond to the process steps of flushing and ventilation.

The timer electric circuit 44 that is preferably provided contacts a seventh switch of the switching position 3 that corresponds to the process step, plasma treatment.

The heating system electric circuit 48 that is preferably provided contacts the eighth switch of the switching positions 1, 2 and 3 that correspond to the process steps of pumping out the treatment chamber, controlling the process gas and plasma treatment.

It is preferred that the heating system electric circuit 48 furthermore contacts the eighth switch of the switching positions 4 and/or 5 that correspond to process steps of flushing and ventilation.

The temperature measuring electric circuit 50 that is preferably provided contacts the ninth switch of the switching positions 1, 2 and 3 that correspond to the process steps of pumping out the treatment chamber, controlling the process gas and plasma treatment.

It is preferred that the temperature measuring electric circuit 50 furthermore contacts the ninth switch of the switching positions 4 and/or 5 that correspond to the process steps of flushing and ventilation.

The pump electric circuit 34 that is preferably provided contacts the tenth switch of the switching positions 1, 2 and 3 that corresponds to the process steps of pumping out the treatment chamber, controlling the process gas and plasma treatment.

It is preferred that the pump electric circuit 34 furthermore contacts the tenth switch of the switching positions 4 and/or 5 that correspond to the process steps of flushing and ventilation.

The power supply unit electric circuit 36 that is preferably provided contacts the eleventh switch of the switching positions 1, 2 and 3 that correspond to the process steps of pumping out the treatment chamber, introducing the process gas and plasma treatment.

It is preferred that the power supply unit electric circuit 36 furthermore contacts the eleventh switch of the switching positions 4 and/or 5 that correspond to the process steps of flushing and ventilation.

In FIG. 1b, the sequential switching element 30 is located in the switching position 0 (cf. also FIG. 1a). All switches of the switching position 0, by way of example the switch 56 of the flushing process electric circuit 52, are closed. However, since none of the electric circuits 34, 36, 38, 40, 42, 44, 46, 48, 50, 52, 54 contacts the switches of the switching position 0, all the electric circuits 34, 36, 38, 40, 42, 44, 46, 48, 50, 52, 54 are opened in the switching position 0. Consequently, in the switching position 0, the low pressure plasma system 10 is switched off (cf. FIG. 1a).

Figure 2B:
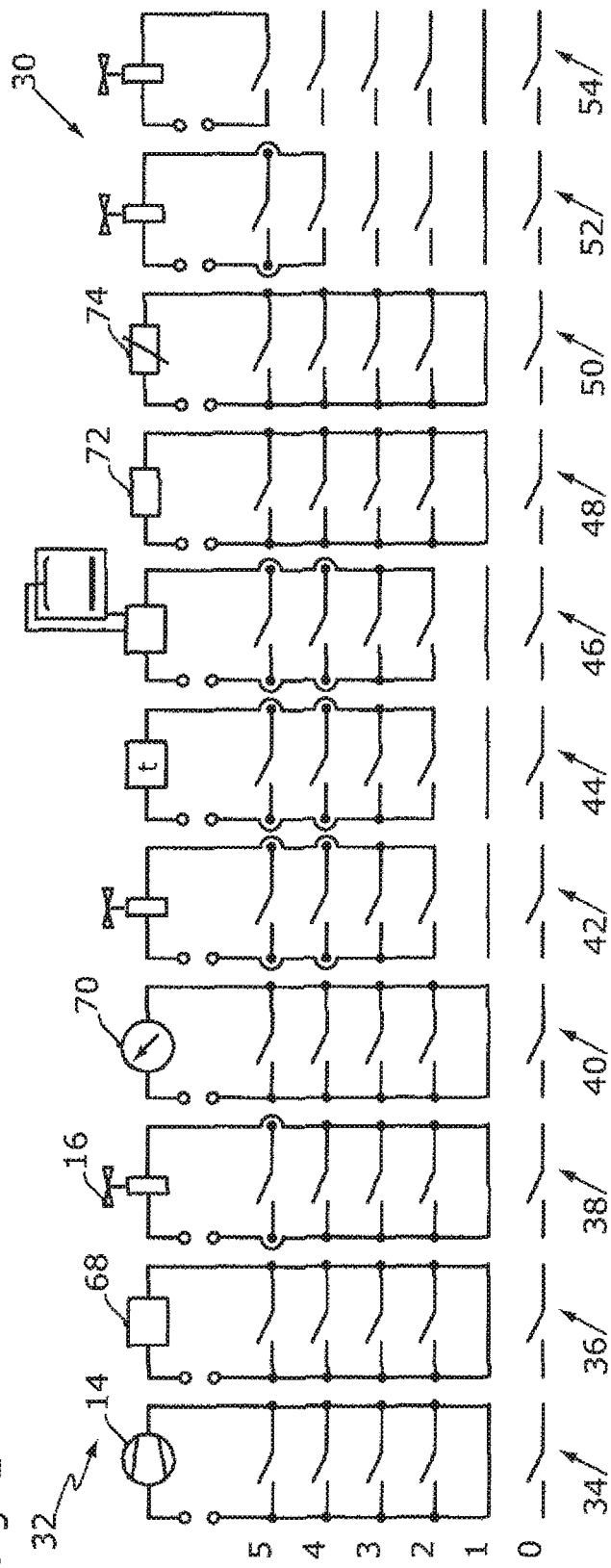
FIG. 2b illustrates schematically the controller of the plasma system in accordance with the FIG. 2a in the switching position 1.

FIG. 2a illustrates the low pressure plasma system 10 in the switching position 1. FIG. 2b illustrates the controller 32 of the low pressure plasma system 10 (cf. FIG. 2a) in this switching position 1. The switching circuits 34, 36, 38, 40, 42, 44, 46, 48, 50, 52, 54 are connected in such a manner that the pump switching circuit 34, the power supply unit switching circuit 36, the vacuum switching circuit 38, the pressure measuring switching circuit 40 and also the heating switching circuit 48 and the temperature measuring electric circuit 50 are closed.

The gas supply switching circuit 42, the timer switching circuit 44, the plasma switching circuit 46 and also the flushing process electric circuit 52 and the ventilation process electric circuit 54 are opened. As a consequence, in the illustrated switching position 1, the pump 14, a power supply unit 68 of the low pressure plasma system 10 (cf. FIG. 2a), a pump valve 16, a pressure measuring device 70, a heating system 72 and also a temperature measuring element 74 are active. The pump 14 is activated by means of a pump power supply unit (not illustrated).

The power supply unit 68 supplies the low pressure plasma system 10 with voltage, in particular with a control voltage (for example 24 Volt direct current voltage). The pressure measuring device 70 is connected to the pressure display 25 (cf. FIG. 1a) in order to display the pressure that is measured by means of the pressure measuring device 70. A component or a probe that is introduced into the treatment chamber 12 (cf. FIG. 1a) is heated by means of the heating system 72. The temperature is monitored by means of the temperature measuring element 74. The switching position 1 of the sequential switching element 30 consequently corresponds to the process step "pumping out the treatment chamber" in which the treatment chamber 12 (cf. FIG. 1a) is at least in part evacuated and is heated by means of the heating system 72. The pressure in the treatment chamber 12 is displayed on the pressure display 26 (cf. FIG. 1a).

Figure 3A:
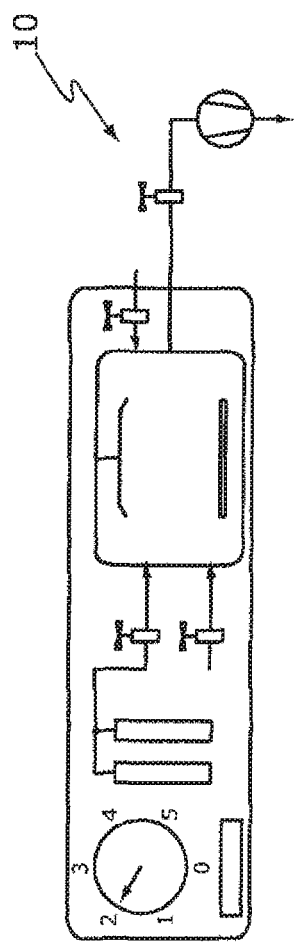
FIG. 3a illustrates a plan view of a low pressure plasma system in accordance with the invention in the switching position 2.

FIG. 3a illustrates the low pressure plasma system 10 in the switching position 2. Switching position 2 corresponds to the process step, "controlling the process gas".

Figure 3B:
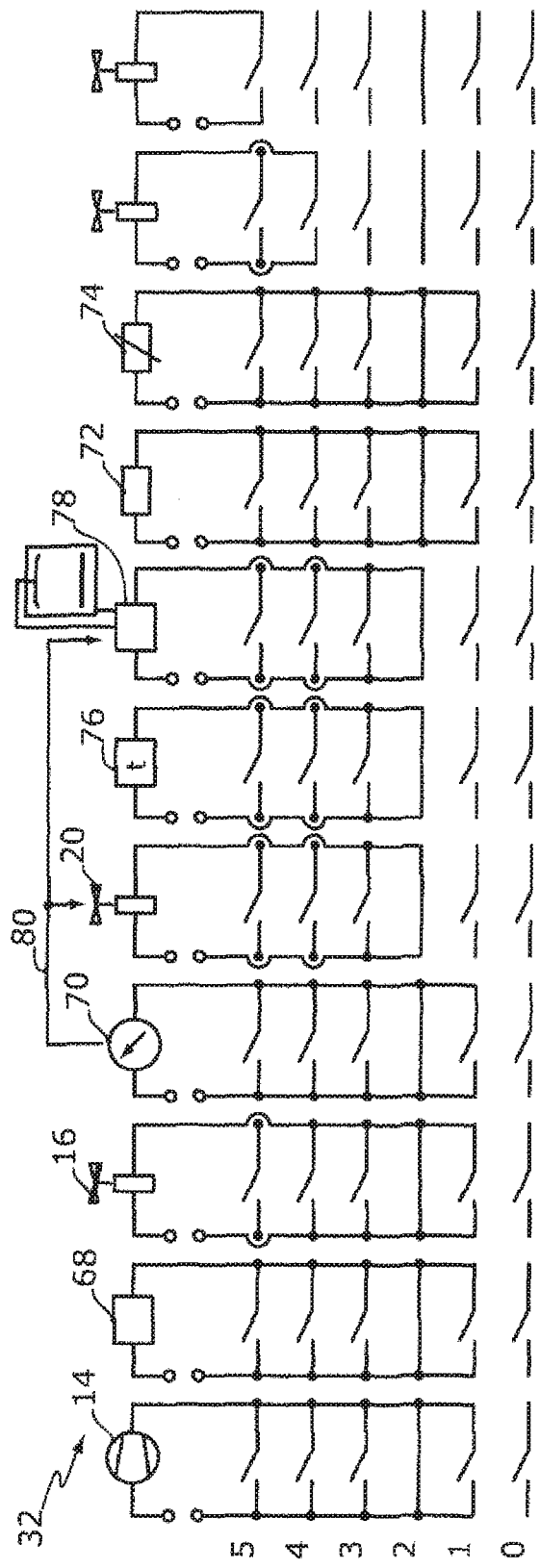
FIG. 3b illustrates schematically the controller of the plasma system in accordance with the FIG. 3a in the switching position 2.

FIG. 3b illustrates the controller 32 in this switching position 2. In this switching position 2, the pump 14, the power supply unit 68, the pump valve 16, the pressure measuring device 70, the heating system 72 and also the temperature measuring element 74 are activated. In addition thereto, the gas supply valve 20, a timer 76 and a plasma generator 78 are activated.

The pressure measuring device 70 is embodied for the purpose of transmitting a first enable signal to the gas supply valve 20 and the plasma generator 78 so as to enable same. This first enable signal is symbolized in FIG. 2b by means of a first arrow 80. The gas supply valve 20 is consequently only opened if the opening occurs by means of the first enable signal of the pressure measuring device 70. In other words, the gas is only then supplied into the treatment chamber 12 (cf. FIG. 1a) if the pressure measuring device 70 has measured the gas supply by way of the first enable signal after achieving a desired and set base pressure. Although the first enable signal (cf. arrow 80) also enables the plasma generator 78, the plasma however is only ignited if the plasma generator is also enabled by the timer 76. This is not yet the case during the process of controlling the process gas.

Figure 4A:
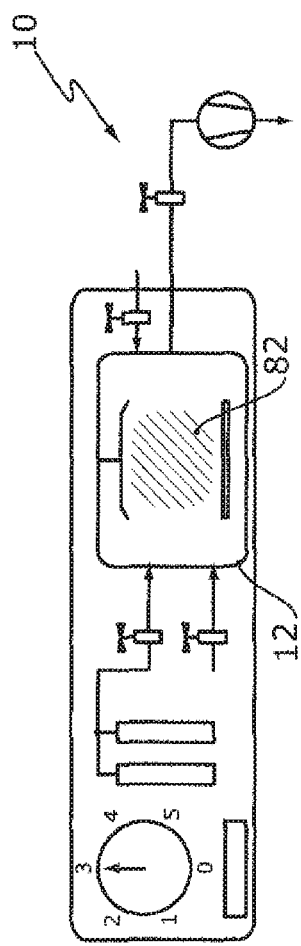
FIG. 4a illustrates a plan view of a low pressure plasma system in accordance with the invention in the switching position 3.

FIG. 4a illustrates the low pressure plasma system 10 in the switching position 3. The switching position 3 corresponds to the process step, "plasma treatment". In this switching position 3, a plasma 82 is ignited in the treatment chamber 12. In this switching position, the "actual" treatment of a component that is introduced into the treatment chamber 12 occurs.

Figure 4B:
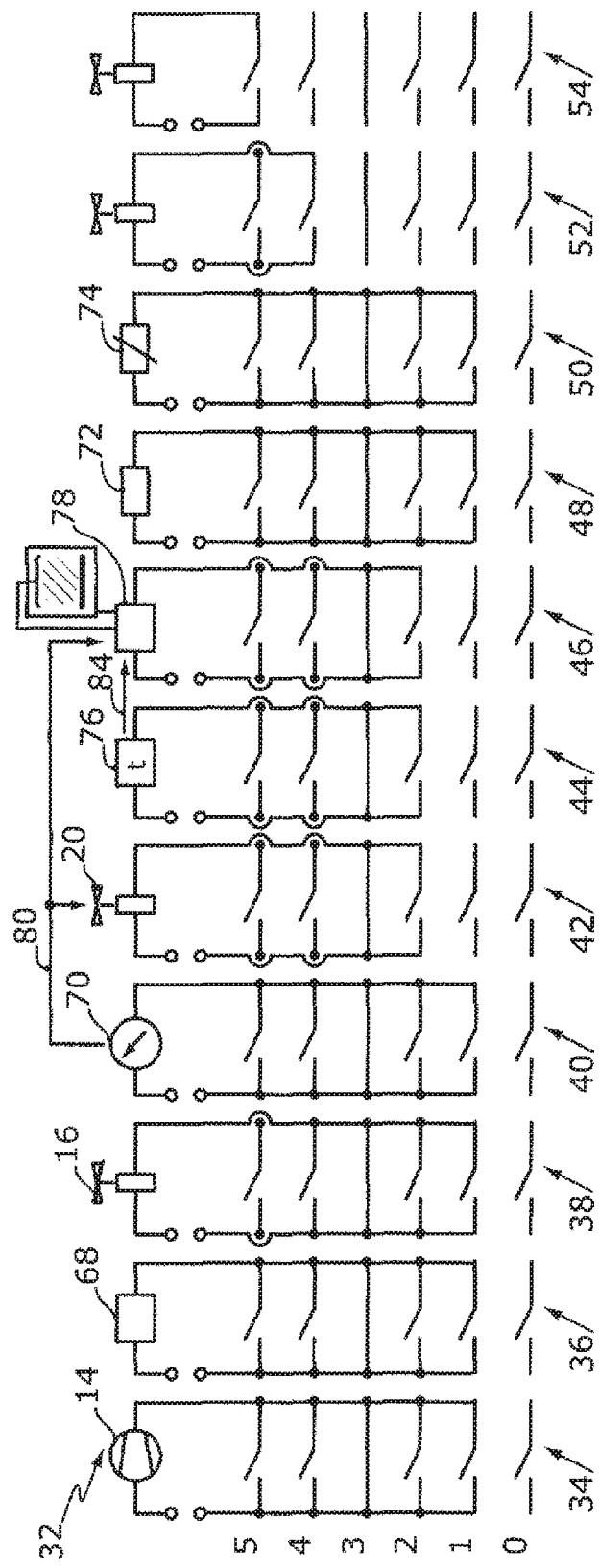
FIG. 4b illustrates schematically the controller of the plasma system in accordance with the FIG. 4a in the switching position 3.

FIG. 4b illustrates the controller 32 in the switching position 3. The pump electric circuit 34, the power supply unit electric circuit 36, the vacuum electric circuit 38, the pressure measuring electric circuit 40, the gas supply electric circuit 42, the timer electric circuit 44, the plasma electric circuit 46, the heating system electric circuit 48 and also the temperature measuring electric circuit 50 are closed. Merely the flushing process electric circuit 52 and the ventilation process electric circuit 54 are opened or interrupted. As a consequence, the pump 14, the power supply unit 68, the pump valve 16, the pressure measuring device 70, the gas supply valve 20, the timer 76, the plasma generator 78, the heating system 72 and also the temperature measuring element 74 are activated. A first enable signal (symbolized by means of a first arrow 80) enables the gas supply valve 20 and also the plasma generator 78. In addition thereto, the timer 76 enables the plasma generator 78 by means of a second enable signal (symbolized by means of a second arrow 84).

The plasma generator 78 is only activated if both enable signals are present. The timer 76 only enables the plasma generator 78 during a preset enable time period. As a consequence, it is ensured that the treatment time period does not exceed a treatment time period that is input into the timer 76.

FIG. 5a illustrates the low pressure plasma system 10 in the switching position 4. The switching position 4 corresponds to the process step, "ventilation".

FIG. 5b illustrates the controller 32 in this switching position 4. The circuits 34, 36, 38, 40, 42, 44, 46, 48, 50, 52, 54 are embodied in such a manner that in the switching position 4 the pump 14, the power supply unit 68, the pump valve 16, the pressure measuring device 70, the heating system 72, the temperature measuring element 74 and also the flushing valve 28 are activated. In the switching position 4, in other words during the process step "flushing", the treatment chamber 12 (cf. FIG. 1a) is consequently flushed, in that flushing gas simultaneously flows by way of the flushing valve 28 into the treatment chamber 12 and the treatment chamber 12 is pumped out by way of the pump valve 16 and the pump 14.

Figure 6A:
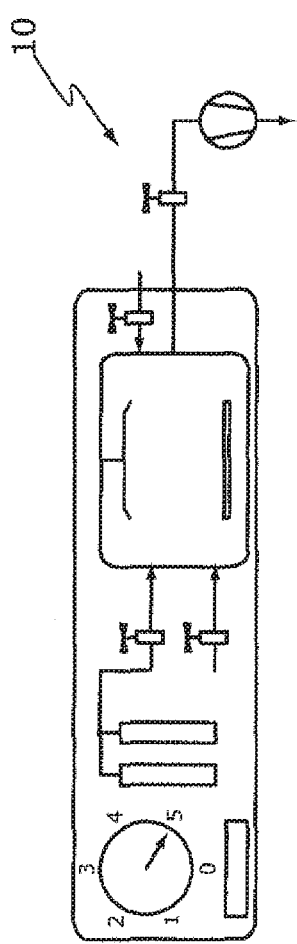
FIG. 6a illustrates a plan view of a low pressure plasma system in accordance with the invention in the switching position 5.

FIG. 6a illustrates the low pressure plasma system 10 in the switching position 5. Switching position 5 corresponds to the process step, "flushing".

Figure 6B:
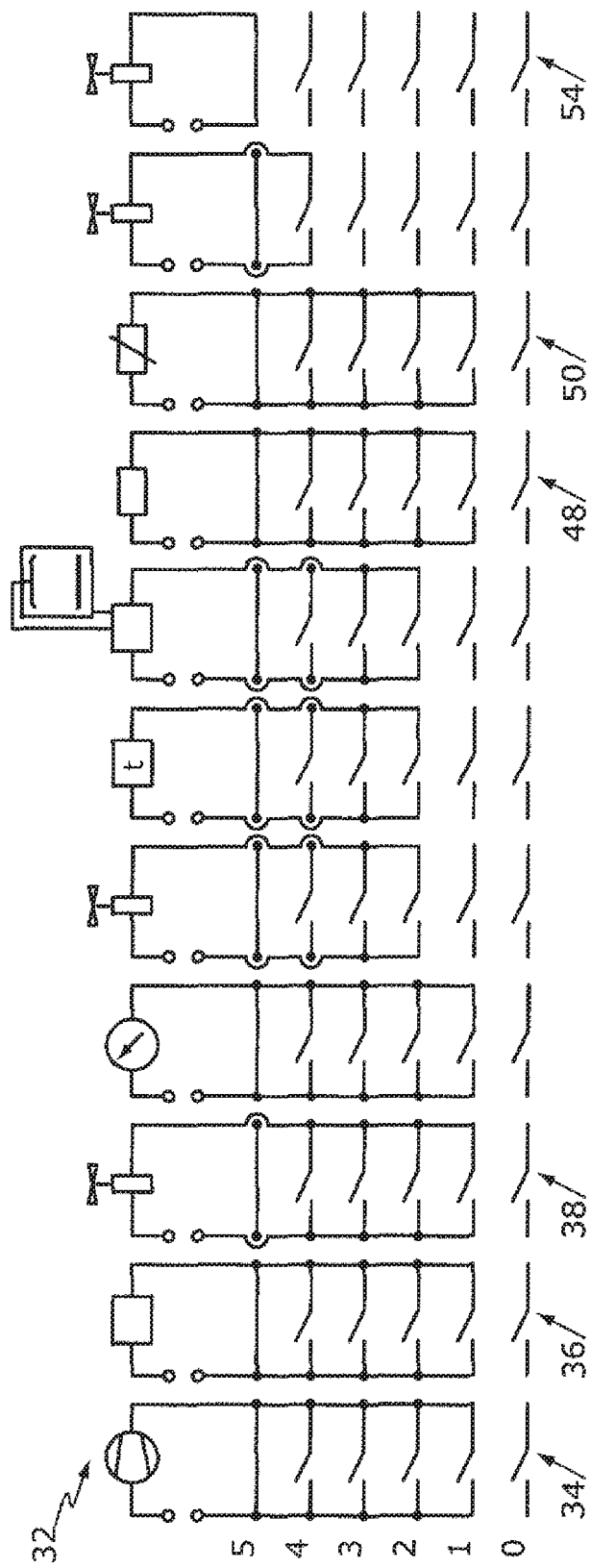
FIG. 6b illustrates schematically the controller of the plasma system in accordance with the FIG. 6a in the switching position 5.

FIG. 6b illustrates the controller 32 in this switching position 5. In this switching position 5, the power supply unit electric circuit 36, the heating system electric circuit 48 and also the temperature measuring electric circuit 50 are closed. One or multiple of these electric circuits could however also be opened in the switching position 5. Furthermore, the pump electric circuit 34 is closed. The treatment chamber 12 (cf. FIG. 1a) however is not evacuated since the vacuum electric circuit 38 is opened. The pump electric circuit 34 could also be opened in this switching position. Finally, the ventilation process electric circuit 54 is closed so that the treatment chamber 12 (cf. FIG. 1a) is ventilated.

If the user rotates the sequential switching element 30 one switching position further, the low pressure plasma system 10 is thus located back in the disconnected state (cf. FIG. 1a). The user can consequently rotate the sequential switching element 30 one rotation clockwise in order to perform a complete treatment process for a component. This renders possible a particularly simple and reliable operation of the low pressure plasma system 10.

In summary, the invention relates to a low pressure plasma system. The low pressure plasma system comprises a treatment chamber. The treatment chamber is pumped out in a first process step, pumping out, by means of a pump. In a second process step, controlling the process gas, a gas supply valve is opened in addition in order to achieve a defined gas composition in the treatment chamber at low pressure. In a third process step, plasma treatment, a plasma generator is switched on in order to ignite a plasma in the treatment chamber. In a fourth process step, flushing, a flushing valve can be opened in order to flush the treatment chamber. In this process step, the gas supply valve is closed and the plasma generator is disconnected. In a fifth process step, ventilation, the treatment chamber can be ventilated by way of a ventilation valve. Switching positions of a sequential switching element, which is preferably in the form of a rotary switch, correspond to the process steps. The sequential switching element can comprise a zero switching position in which the low pressure plasma system is switched off. The sequential switching element renders possible a simple embodiment of the low pressure plasma system and also its intuitive operation.

The sequential switching element can be actuated by means of a user of the low pressure plasma system step-by-step in the switching positions that follow one another. The low pressure plasma system is embodied without an, in particular electric, drive for actuating the sequential switching element. In other words, the low pressure plasma system is embodied in such a manner that the switching positions that follow one another of the sequential switching element can be set exclusively by means of a user of the low pressure plasma system, but not by means of the low pressure plasma system itself.

What is claimed is:

1. A low pressure plasma system comprises:
    a treatment chamber that can be at least in part evacuated,
       a gas supply valve, a plasma generator and a controller;
    wherein the controller comprises a vacuum electric circuit, a gas supply electric circuit and a plasma electric circuit;
    wherein the vacuum electric circuit controls a pump which can be connected to the low pressure plasma system and/or a pump valve of the low pressure plasma system;
    wherein the gas supply electric circuit controls the gas supply valve;
    wherein the plasma electric circuit controls the plasma generator;
    wherein the controller comprises a sequential switching element having switching positions that follow one another for setting process steps that follow one another;
    wherein the sequential switching element is embodied so as in each switching position to interrupt and to close respectively the vacuum electric circuit, the gas supply electric circuit and the plasma electric circuit by a plurality of switches that are electrically isolated from one another;
    wherein the sequential switching element comprises a first switching position in which the vacuum electric circuit is closed but the gas supply electric circuit and the plasma electric circuit are interrupted;
    wherein the sequential switching element comprises a second switching position in which the vacuum electric circuit and the gas supply electric circuit are closed but the plasma electric circuit is interrupted;

wherein the sequential switching element comprises a third switching position in which the vacuum electric circuit, the gas supply electric circuit and the plasma electric circuit are closed;

wherein the sequential switching element comprises in each case the plurality of switches for controlling the vacuum electric circuit the gas flow electric circuit and the plasma electric circuit, and the plurality of switches can be opened or closed one after the other; and wherein the sequential switching element is embodied so as in each switching position to close the plurality of switches of the sequential switching element, said plurality of switches being electrically isolated from one another.

2. The low pressure plasma system of claim 1, wherein the controller comprises a flushing process electric circuit having a flushing valve, wherein the sequential switching element is embodied so as to interrupt and to close the flushing process electric circuit, wherein the sequential switching element comprises a fourth switching position in which the vacuum electric circuit and the flushing process electric circuit are closed but the gas supply electric circuit and the plasma electric circuit are interrupted, wherein the flushing process electric circuit is interrupted in the first, second and third switching positions.

3. The low pressure plasma system of claim 1, wherein the controller comprises a ventilation process electric circuit having a ventilation valve, wherein the sequential switching element is embodied so as to interrupt and to close the ventilation process electric circuit, wherein the sequential switching element comprises a fifth switching position in which the ventilation process electric circuit is closed but the vacuum electric circuit, the gas supply electric circuit and the plasma electric circuit are interrupted, wherein the ventilation process electric circuit is interrupted in the first, second and third switching positions.

4. The low pressure plasma system of claim 1, wherein the controller comprises a pressure measuring electric circuit having a pressure measuring device, wherein the sequential switching element is embodied so as to interrupt and to close the pressure measuring electric circuit, wherein the pressure measuring electric circuit is closed in the first, second and third switching positions.

5. The low pressure plasma system of claim 4, wherein the pressure measuring device is embodied for the purpose of transmitting a first enable signal to the gas supply valve to enable the same and/or to the plasma generator to enable the same.

6. The low pressure plasma system of claim 1, wherein the controller comprises a timer electric circuit having a timer, wherein the sequential switching element is embodied so as to interrupt and to close the timer electric circuit, wherein the timer electric circuit is closed in the third switching position.

7. The low pressure plasma system of claim 6, wherein the timer is embodied for the purpose of transmitting a second enable signal to the plasma generator to enable the same.

8. The low pressure plasma system of claim 1, wherein the controller comprises a heating system electric circuit having a heating system, wherein the sequential switching element is embodied so as to interrupt and to close the heating system electric circuit, wherein the heating system electric circuit is closed in the third switching position.

9. The low pressure plasma system of claim 8, wherein the controller comprises a temperature measuring electric circuit having a temperature measuring element, wherein the sequential switching element is embodied so as to interrupt and to close the temperature measuring electric circuit, wherein the temperature measuring electric circuit is closed in the third switching position.

10. The low pressure plasma system of claim 1, wherein the controller comprises a power supply unit electric circuit having a power supply unit, wherein the sequential switching element is embodied so as to interrupt and to close the power supply unit electric circuit, wherein the power supply unit electric circuit is closed in the first, second and third switching positions.

11. The low pressure plasma system of claim 1, wherein the controller comprises a pump electric circuit having a pump power supply unit, wherein the sequential switching element is embodied so as to interrupt and to close the pump electric circuit, wherein the pump electric circuit is closed in the first, second and third switching positions.

12. The low pressure plasma system of claim 1, wherein the controller comprises a safety electric circuit having a safety switch being a door switch of the treatment chamber, wherein the sequential switching element is embodied so as to interrupt and to close the safety electric circuit, wherein the safety electric circuit is closed in the first, second and third switching positions.

13. The low pressure plasma system of claim 1, wherein the vacuum electric circuit, the gas supply electric circuit and/or the plasma electric circuit comprises a lamp being a light emitting diode for illustrating the respective process step.

14. The low pressure plasma system of claim 1, wherein the sequential switching element comprises a zero switching position in which all the electric circuits of the controller are interrupted.

15. The low pressure plasma system of claim 1, wherein the sequential switching element is embodied in the form of a rotary switch.

* * * * *